US012727128B2

(12) United States Patent
Seo

(10) Patent No.: US 12,727,128 B2

(45) Date of Patent: Sep. 1, 2026

(54) VEHICLE CONTROLLER HEAT DISSIPATION MODULE

(71) Applicant: HYUNDAI MOBIS CO., LTD., Seoul (KR)

(72) Inventor: Jun Seong Seo, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 116 days.

(21) Appl. No.: 18/427,953

(22) Filed: Jan. 31, 2024

(65) Prior Publication Data

US 2025/0040105 A1 Jan. 30, 2025

(30) Foreign Application Priority Data

Jul. 25, 2023 (KR) ........................ 10-2023-0096883

(51) Int. Cl.
*H05K 7/20* (2006.01)

(52) U.S. Cl.
CPC ..... *H05K 7/20863* (2013.01); *H05K 7/20881* (2013.01)

(58) Field of Classification Search
CPC ............ H05K 7/20863; H05K 7/20881; F28D 15/06; F28D 15/02; F28D 15/04; H01L 23/427
USPC .................................. 165/80.4, 104.33, 185
See application file for complete search history.

(56) References Cited

U.S. PATENT DOCUMENTS 3,481,393 A * 12/1969 Chu ...................... H10W 40/47 165/104.31
5,144,531 A * 9/1992 Go ........................ H10W 40/47 257/E23.098
6,970,355 B2 * 11/2005 Ellsworth, Jr. ........ H05K 7/207 174/15.1
7,492,596 B1 * 2/2009 Peng ..................... H10W 40/73 165/104.33
8,432,691 B2 * 4/2013 Toftloekke .......... F28D 15/0266 361/679.55
10,036,596 B2 * 7/2018 Lan ..................... F28D 15/0233
10,739,832 B2 * 8/2020 O'Connell ................ F28F 1/32
11,036,118 B2 * 6/2021 Chung ................ F28D 15/0266
11,412,638 B2 * 8/2022 Chen .................. H05K 7/20809
11,477,911 B1 * 10/2022 He ..................... H05K 7/20154
11,839,050 B2 * 12/2023 Wu .................... H05K 7/20145
2005/0201059 A1 * 9/2005 Lin ....................... H10W 40/73 361/700

(Continued)

*Primary Examiner* — Claire E Rojohn, III
(74) *Attorney, Agent, or Firm* — NovoTechIP International PLLC

(57) ABSTRACT

A vehicle controller heat dissipation module according to one embodiment of the present invention may include a cover which covers an upper surface of a vehicle controller, a heat transfer part attached to a heating element in the vehicle controller, a heat pipe which is disposed in a horizontal direction of the vehicle controller heat dissipation module to be in adjacent to or in contact with the heat transfer part and to receive heat generated by the heating element, a heat dissipation fin which is disposed in contact with the heat pipe and emits heat, a first fan which is disposed in a side surface of the vehicle controller and introduces air into the vehicle controller, and a second fan which is either adjacent to or passes through the cover, is disposed above the heat dissipation fin, and discharges air to an outside of the vehicle controller.

14 Claims, 9 Drawing Sheets

(56) References Cited

U.S. PATENT DOCUMENTS

2007/0070600 A1* 3/2007 Tomioka ............. F28D 15/0266 361/688
2008/0135210 A1* 6/2008 Wang .................. F28D 15/0233 165/104.33
2009/0097202 A1* 4/2009 Gipson .................. B01D 46/70 95/279
2010/0020504 A1* 1/2010 Chang ....................... G06F 1/20 361/720
2010/0265468 A1* 10/2010 Lin ........................ G03B 21/16 353/57
2011/0000648 A1* 1/2011 Chien ................. F28D 15/0275 165/104.26
2012/0326663 A1* 12/2012 You ......................... B60L 53/22 320/109
2013/0120937 A1* 5/2013 Liao ...................... H10W 40/73 361/700
2014/0116659 A1* 5/2014 Lin ..................... F28D 15/0275 165/121
2014/0290908 A1* 10/2014 Wang .................... H10W 40/00 165/80.2
2014/0371946 A1* 12/2014 Kwak ............... H01M 10/6572 429/90
2015/0327402 A1* 11/2015 Slippey ............. H05K 7/20336 361/714
2016/0366790 A1* 12/2016 Yeh ......................... F28F 13/00
2017/0234623 A1* 8/2017 Fried .................. H05K 7/20336 165/104.26
2017/0235349 A1* 8/2017 Ghioni ...................... G06F 1/20 361/679.47
2017/0295666 A1* 10/2017 Ahn ................... H05K 7/20127
2018/0317343 A1* 11/2018 Lin ......................... G06F 1/203
2018/0374777 A1* 12/2018 Yu ......................... H10W 40/43
2019/0094295 A1* 3/2019 Wolff ................. G01R 31/2874
2019/0146315 A1* 5/2019 Lin ........................... F28F 1/32 165/80.3
2019/0289752 A1* 9/2019 Ma ..................... H05K 7/20881
2019/0335620 A1* 10/2019 Li ........................ F28D 15/0275
2019/0364697 A1* 11/2019 Chen .................. H05K 7/20336
2020/0077867 A1* 3/2020 Thiyagarajan ...... F28D 15/0275
2020/0091038 A1* 3/2020 Yu ......................... H10W 40/43
2020/0164297 A1* 5/2020 Liao ................... B01D 46/0005
2020/0355443 A1* 11/2020 Tochigi ............... F28D 15/0275
2020/0386490 A1* 12/2020 Huang ...................... F28F 1/32
2022/0157781 A1* 5/2022 Chang ................ H05K 7/20218
2023/0090230 A1* 3/2023 Inoue ................... H05K 7/2039 165/80.4
2023/0102571 A1* 3/2023 Sabelstrom ......... F28D 15/0233 361/689
2023/0221078 A1* 7/2023 Chang ................. F28D 15/0275 165/104.21
2023/0324130 A1* 10/2023 Lin ..................... F28D 15/0275
2023/0337406 A1* 10/2023 Bawa .................. F28D 15/0233
2025/0040105 A1* 1/2025 Seo .................... H05K 7/20863
2025/0151242 A1* 5/2025 Burger ............... H05K 7/20854
2025/0159843 A1* 5/2025 Shieh .................. F28D 15/0275

* cited by examiner

VEHICLE CONTROLLER HEAT DISSIPATION MODULE

CROSS-REFERENCE TO RELATED APPLICATIONS

This application claims priority to and the benefit of Korean Patent Application No. 10-2023-0096883, filed on 25 Jul. 2023, the disclosure of which is incorporated herein by reference in its entirety.

TECHNICAL FIELD

The present invention relates to a controller heat dissipation module, and more specifically, to a controller heat dissipation module to which a horizontal heat pipe is applied to reduce the size of a controller.

BACKGROUND

Various types of controllers are mounted in vehicles, and chipsets with higher power consumption have been recently used for supporting various functions and applying high performance features. When a chipset with higher power consumption is used, an amount of heat generated by a controller becomes a problem. Currently, a controller uses a heat pipe, a heat dissipation fin, and a cooling fan to dissipate heat. The controller is formed in a closed box shape in order to prevent foreign matter such as external moisture from being introduced, and the heat pipe may be disposed to pass through the controller in a direction perpendicular to the controller. However, when the controller is disposed vertically, there is a disadvantage in that a space occupied by the controller increases greatly.

Due to a feature of a controller disposed in a limited space in a vehicle, a heat dissipation structure, which prevents the size of the controller from being increased due to an applied heat pipe, prevents foreign matter such as external moisture from being introduced, and also dissipates heat sufficiently, is required.

SUMMARY

The present invention is directed to providing a controller heat dissipation module which maintains a small size of a controller, prevents foreign matter such as external moisture of a vehicle from being introduced into the controller, and also dissipates heat sufficiently.

Objectives to be solved by the present invention are not limited to the above-described objectives, and other objectives which are not described above will be clearly understood by those skilled in the art through the following description.

According to an aspect of the present invention, there is provided a vehicle controller heat dissipation module including a cover which covers an upper surface of a vehicle controller, a heat transfer part adjacent to (or attached to) a heating element, a heat pipe which is disposed in a horizontal direction to be in contact with the heat transfer part and receives heat, a heat dissipation fin which is disposed in contact with the heat pipe and dissipates heat, a first fan which is disposed in a side surface of the vehicle controller and introduces air into the vehicle controller, and a second fan which passes through the cover, is disposed above the heat dissipation fin, and discharges air to an outside of the vehicle controller.

The heat dissipation fin may be disposed at a side opposite to the heat transfer part with respect to the heat pipe.

At least a part of the heat pipe may be in contact with the cover.

The heat dissipation fin may be disposed in a vertical direction, and the heat pipe may pass through and be in contact with the heat dissipation fin.

In the heat dissipation fin, a plurality of heat dissipation plates may be disposed in parallel in the vertical direction.

Lower ends of at least some of the plurality of heat dissipation plates may be bent in one direction.

Lower ends of at least some of the plurality of heat dissipation plates may be bent in both side directions.

Each of the heat dissipation plates may be formed in a wave shape, and a lower end portion of the heat dissipation plate may be formed to be flat in the horizontal direction.

One end portions of the plurality of heat dissipation plates may be disposed in contract with each other to be inclined at predetermined angles in a zigzag manner.

A portion between the heat transfer part and the heat pipe may be coated with a gap filler.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Figure 1:
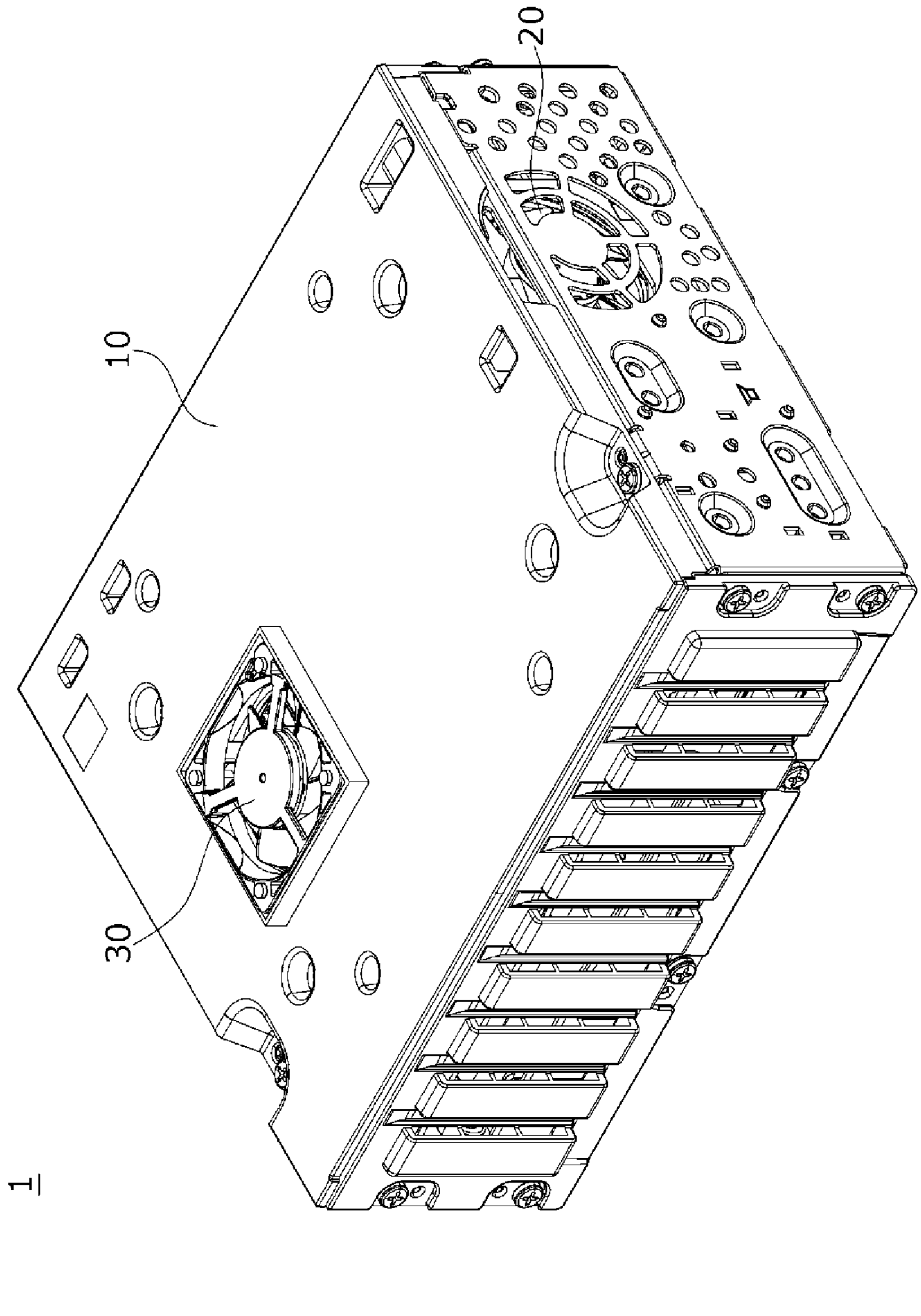
FIG. 1 is a view illustrating a vehicle controller to which a vehicle controller heat dissipation module is applied according to one embodiment of the present invention.

Since the present invention may be variously modified and have several embodiments, specific embodiments will be illustrated in the accompanying drawings and described in detail. However, this is not intended to limit the present invention to the specific embodiments, and it should be appreciated that all changes, equivalents, and substitutes falling within the spirit and technical scope of the present invention are encompassed in the present invention. In the description of the embodiments, certain detailed descriptions of the related art will be omitted when it is deemed that they may unnecessarily obscure the gist of the inventive concept.

While terms such as “first” and “second” may be used to describe various components, such components are not limited by the above terms. These terms are used only to distinguish one component from another.

Terminology used herein is only for the purpose of describing particular embodiments and is not intended to limit the present invention. The singular forms are intended to include the plural forms, unless the context clearly indicates otherwise. In the present specification, it should be understood that the terms “comprise,” “comprising,” “include,” and/or “including” used herein specify the presence of stated features, numbers, steps, operations, elements, components, and/or combinations thereof but do not preclude the presence or addition of one or more other features, numbers, steps, operations, elements, components, and/or combinations thereof.

In addition, throughout the specification, when components are “connected,” this may not only mean that two or more components are directly connected, but this may also mean that two or more components are indirectly connected through other components or are physically connected as well as electrically connected, or are one thing even referred to as different names according to positions or functions thereof.

In addition, when a first component is described as being formed or disposed “on” or “under” a second component, such a description includes both a case in which the two components are formed or disposed in direct contact with each other and a case in which one or more other components are interposed between the two components. In addition, when the first component is described as being formed “on or under” the second component, such a description may include a case in which the first component is formed at an upper side or a lower side with respect to the second component.

Hereinafter, one embodiment of a vehicle controller heat dissipation module will be described in detail with reference to the accompanying drawings, and when the embodiment is described with reference to the accompanying drawings, components which are the same or correspond to each other will be denoted by the same reference numerals, and redundant description thereof will be omitted.

FIG. 1 is a view illustrating a vehicle controller to which a vehicle controller heat dissipation module is applied according to one embodiment of the present invention.

Referring to FIG. 1, a controller 1 applied to a vehicle is formed in a closed shape of four surfaces and accommodates a printed circuit board (PCB) and a chip therein to perform a control function. Although a function of the vehicle controller 1 is improved and also the chip applied in the vehicle controller 1 is improved with high performance, this may need a larger amount of power consumption and increase an amount of heat.

Various types of heat dissipation systems are applied to the vehicle controller 1 in order to maintain a proper temperature condition, and due to limitations such as a size, an installation place, and the like of the vehicle controller 1, a structure for dissipating heat while the size of the controller 1 is maintained is required. In the present invention, a heat pipe 40 in a horizontal direction may be applied in the controller 1 of the vehicle to maintain the size of the vehicle controller 1 and also dissipate heat easily.

As illustrated in FIG. 1, two fans 20 and 30 are applied to the vehicle controller 1. A first fan 20, which is also applied in the conventional case, is disposed on a side surface of the vehicle controller 1 and serves to introduce air into the vehicle controller 1. The second fan 30 is disposed to pass through a cover 10 of the vehicle controller 1 and serves to discharge air upward from the vehicle controller 1. In the case of the conventional vehicle controller 1, air is introduced into the controller 1 through only the first fan 20, however, since the vehicle controller 1 has a closed shape of four surfaces, air cannot flow easily, and heat cannot be efficiently dissipated.

When two fans 20 and 30 are applied, the second fan 30 may discharge air so that air flows easily and internal air of the controller 1 efficiently circulates to discharge air heated by heating to the outside of the controller 1.

Figure 2:
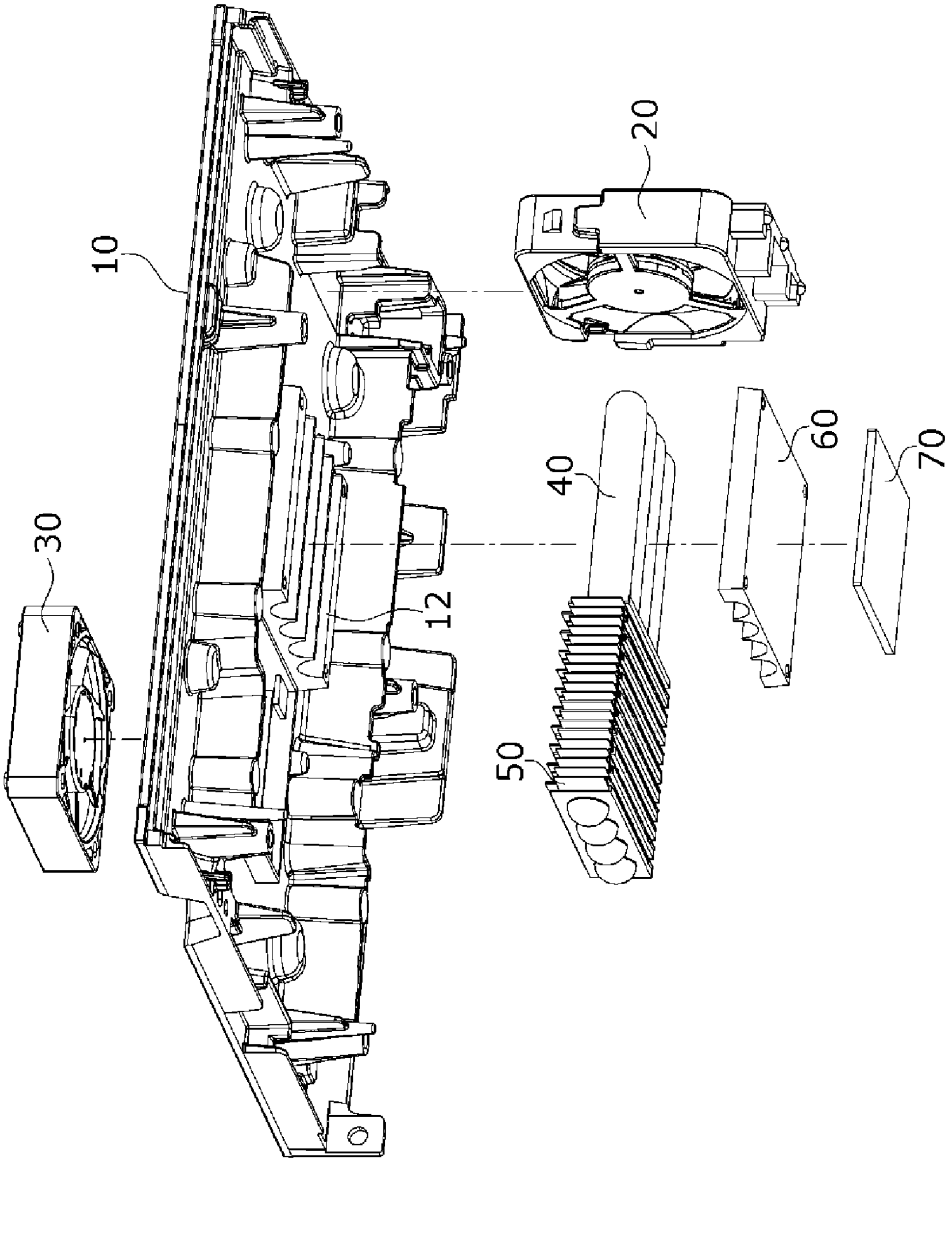
FIG. 2 is an exploded view illustrating the vehicle controller heat dissipation module according to one embodiment of the present invention.

FIG. 2 is an exploded view illustrating the vehicle controller heat dissipation module according to one embodiment of the present invention.

Referring to FIG. 2, the heat dissipation module of the vehicle controller 1 according to one embodiment of the present invention may include the cover 10 which covers an upper surface of the vehicle controller 1, and a heat transfer part 60 is adjacent to or attached to a heating element 70. The heat pipe 40 can be disposed in the horizontal direction and disposed in contact with the heat transfer part 60 to receive heat generated by the heating element 70. Heat dissipation fins 50 are disposed in contact with the heat pipe 40 to dissipate heat, a first fan 20 is disposed in the side surface of the vehicle controller 1 and introduces air into the vehicle controller 1, and the second fan 30, which either passes through the cover 10 or is adjacent to the cover 10, is disposed above the heat dissipation fins 50, and discharges air to the outside of the vehicle controller 1. The heating element 70 can be a high power consumption chipset, for example.

The heat pipe 40 may be disposed in contact with the heating element 70 attached to the PCB, or can be closely adjacent to the heating element. The heat pipe 40 may be formed of a material with high thermal conductivity and may serve to transfer heat generated by the heating element 70. In the case of the present embodiment, the heat pipe 40 may be disposed in the horizontal direction and have a long rod shape formed to extend in the horizontal direction. The heat pipe 40 may be provided as a plurality of rod-shaped heat pipes 40 disposed in parallel in a longitudinal direction. Side surfaces of the heat pipes 40 may be disposed in contact with each other to transfer heat, and at least parts of the heat pipes 40 may overlap and be integrally formed.

The plurality of rod-shaped heat pipes 40 may be disposed to be spaced a predetermined distance from each other. When the plurality of rod-shaped heat pipes 40 are disposed in parallel to be spaced the predetermined distance from each other, air introduced by the first fan 20 may flow in the longitudinal direction of the heat pipe 40 through a space between the heat pipes 40. Air discharged upward by the second fan 30 may flow in a direction perpendicular to the heat pipes 40 through the space between the heat pipes 40 to be discharged upward. That is, a contact area with discharged air can increase and heat can be easily dissipated. Even when the heat pipe 40 is not rod-shaped, it does not matter as long as it has a structure capable of sufficiently receiving heat from the heating element 70.

The heat pipes 40 may be disposed under the cover 10, and at least parts thereof may be disposed in contact with the cover 10. The cover 10 may cover an upper portion of the controller 1 and dissipate heat generated by the controller 1.

Accordingly, the cover 10 may be formed of a material with high thermal conductivity, and in the conventional controller 1, at least a part of the cover 10 may protrude in contact with the heating element 70 to dissipate heat.

In the case of the present embodiment, since the heat pipe 40 is disposed on a thermoelectric element, the cover 10 may be formed to protrude in contact with at least a part of an upper portion of the heat pipe 40. A portion at which the cover 10 and the heat pipe 40 are in contact with each other may be formed to correspond to the shape of the heat pipe 40 and formed of a material with higher thermal conductivity than other portions. At least a part of the cover 10 may be in contact with the heat pipe 40 to directly emit heat generated by the heating element 70 to the outside.

Since the heat pipe 40 is disposed in the horizontal direction, at least a part of the heat pipe 40 may be disposed under the second fan 30. Since the second fan 30 is disposed to pass through the cover 10, the second fan 30 may be disposed above at least a part of the heat pipe 40 and may dissipate heat transferred from the heat pipe 40. The first fan 20 and the second fan 30 may operate so that air is introduced through the side surface of the vehicle controller 1 by the first fan 20 and discharged from the vehicle controller 1 by the second fan 30 and an air flow path is positioned on the heat pipe 40. Since the first fan 20 operates in a direction in which air is introduced into the controller 1, the second fan 30 may be disposed in a direction in which air is discharged to the outside of the controller.

The heat dissipation fins 50 formed in contact with the heat pipe 40 may be disposed on one side of the heat pipe 40. The heat dissipation fins 50 are disposed in contact with at least a part of the heat pipe 40 to dissipate heat generated by the heating element 70 when the heat is transferred through the heat pipe 40. The heat dissipation fin 50 may be formed of a material with high thermal conductivity, and larger a cross-sectional area is, more efficient heat dissipates, and thus the heat dissipation fins 50 may have a shape in which a plurality of plates are disposed in parallel.

The heat transfer part 60 may be disposed between the heat pipe 40 and the heating element 70. The heat transfer part 60 serves to transfer heat generated by the heating element 70 to the heat pipe 40. As in the present embodiment, when a cross section of the heat pipe 40 has a circular shape, and the heat pipe 40 is disposed above the heating element 70, only a small area of a lower side of the heat pipe 40 is in contact with the heating element 70 when there is no heat transfer part 60. Accordingly, the heat transfer part 60 may be formed in a shape corresponding to an outer boundary of the heat pipe 40 and disposed between the heat pipe 40 and the heating element 70. When the heat pipe 40 is formed in a wide flat shape, the heat pipe 40 and the heating element 70 may be in contact with each other at a wide area, and thus there may be a case in which the heat transfer part 60 is not provided.

Figure 3:
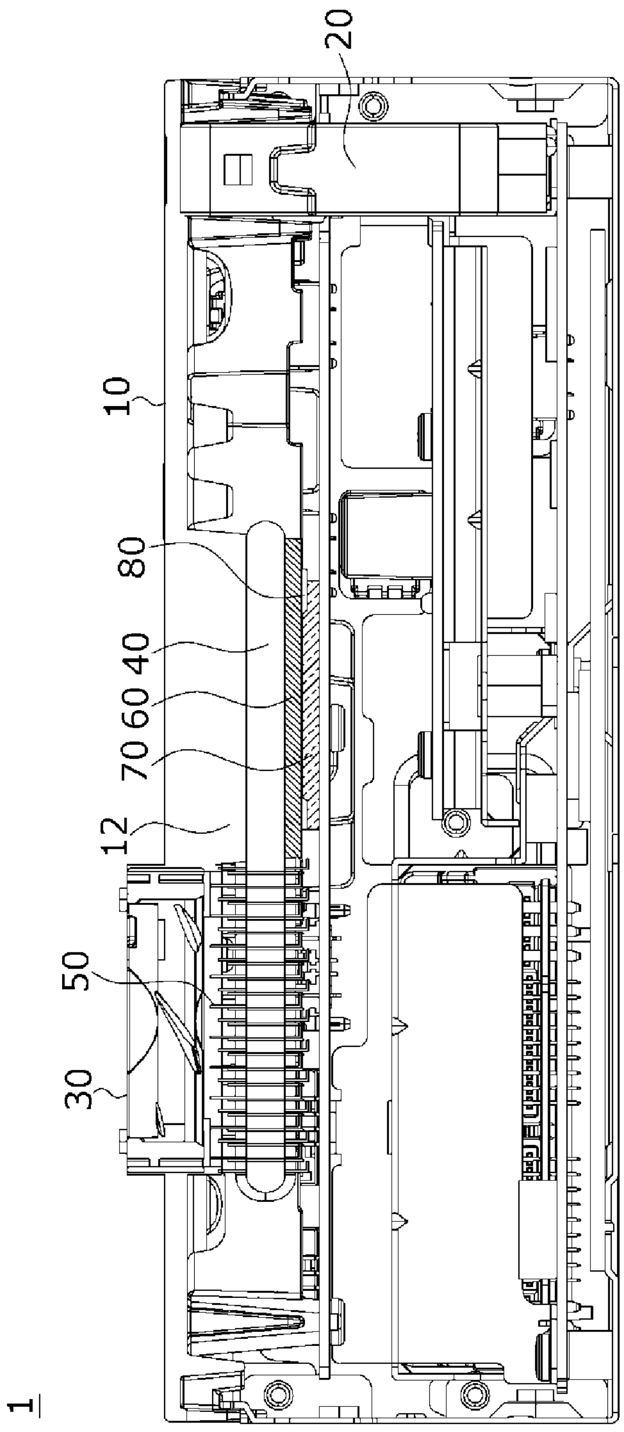
FIG. 3 is a cross-sectional view illustrating the vehicle controller to which the vehicle controller heat dissipation module is applied according to one embodiment of the present invention.

FIG. 3 is a cross-sectional view illustrating the vehicle controller to which the vehicle controller heat dissipation module is applied according to one embodiment of the present invention.

Referring to FIG. 3, the vehicle controller 1 has a closed structure of four surfaces, the first fan 20 may be disposed on the side surface of the vehicle controller 1, and the second fan 30 may be disposed on the upper surface of the vehicle controller 1 so that air flows in the controller 1. The long rod-shaped heat pipe 40 may be disposed in the horizontal direction to correspond to a direction of the air flow path, one side of the heat pipe 40 may be disposed at a portion at which the heating element 70 is positioned, and the other side may be disposed at a portion at which the second fan 30 is positioned.

In the case of the present embodiment, the heat dissipation fin 50 is disposed at one side of the heat pipe 40, and the heat pipe 40 is disposed to pass through the heat dissipation fin 50 in a perpendicular direction. When the heat pipe 40 is disposed to pass through the heat dissipation fin 50, a space occupied by the heat dissipation fin 50 is reduced, and a contact area between the heat dissipation fin 50 and the heat pipe 40 can be increased. The heat dissipation fin 50 may have the shape in which the plurality of plates are disposed in parallel.

A side opposite to a portion at which the heat dissipation fin 50 of the heat pipe 40 is disposed may be a portion in contact with the heating element 70. Referring to FIG. 3, since air flows from a right side to a left side, the heating element 70 may be disposed at a right side of the heat pipe 40, and the heat dissipation fin 50 may be disposed at a left side of the heat pipe 40 so that an air flow direction and a heat flow direction are the same. Air may flow along the heat dissipation module and easily dissipate heat generated by the heating element 70.

The heat transfer part 60 may be disposed between the heating element 70 and the heat pipe 40, and when the heat pipe 40 is formed in a non-flat shape such as a cylindrical shape, the heat transfer part 60 can fill an empty space so that the heat pipe 40 is in sufficient contact with the heating element 70 without performing a separate shaping process on the heat pipe 40. The heat transfer part 60 and the heat pipe 40 may be formed of a material with high thermal conductivity and formed of the same material.

Since an upper surface of the heating element 70 is in contact with the thermoelectric element or the heat pipe 40, the upper surface of the heating element 70 may be coated with a gap filler 80. When the coating performed with the gap filler 80, an air layer to be formed on a contact surface may become smaller than a case in which the heating element 70, the heat transfer part 60, and the heat pipe 40 which are hard solid types are in contact with each other. When the air layer is formed, since heat transfer can be interfered, the coating is performed with the gap filler 80 to prevent the interference.

At least a part of the heat pipe 40 may be in contact with the cover 10. Since the cover 10 covers the upper surface of the controller 1, the cover 10 may be formed of a material with superior thermal conductivity to dissipate heat independently of the heat pipe 40 and the fan. Accordingly, heat generated by the heating element 70 may be transferred to the heat transfer part 60 and the heat pipe 40 and directly emitted to the outside through the cover 10.

Figure 4:
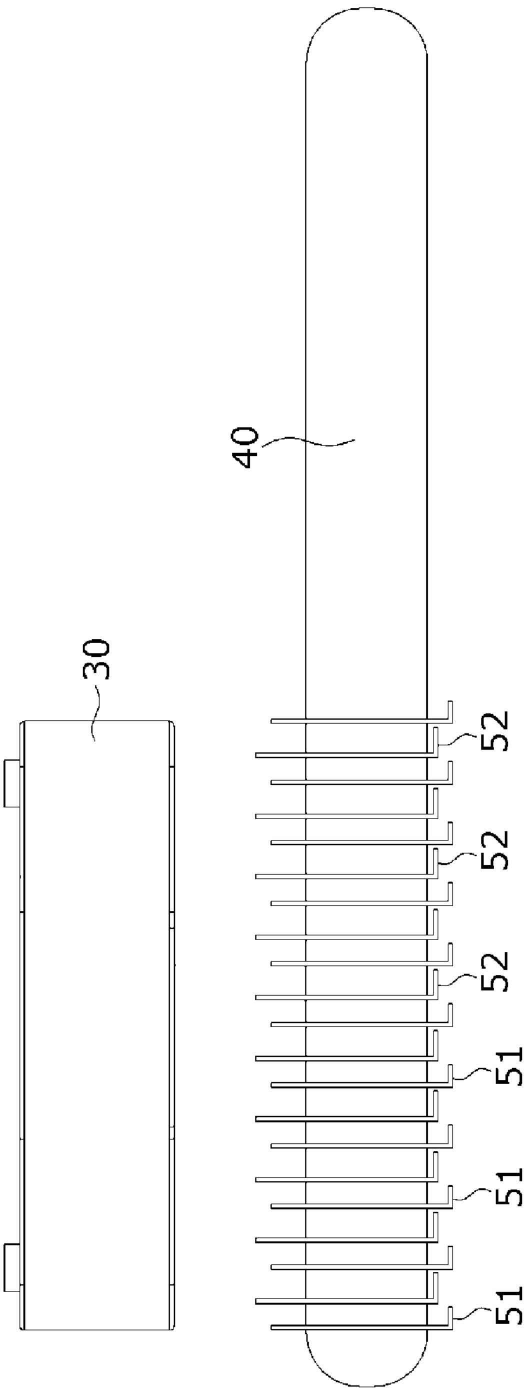
FIG. 4 is a view illustrating a heat dissipation fin of the vehicle controller heat dissipation module according to one embodiment of the present invention.

FIG. 4 is a view illustrating the heat dissipation fin of the vehicle controller heat dissipation module according to one embodiment of the present invention.

Referring to FIG. 4, in the heat dissipation fin 50 of the heat dissipation module of the vehicle controller 1 according to one embodiment of the present invention, a plurality of heat dissipation plates are disposed in parallel to be spaced a predetermined gap from each other. A hole may be formed in a center of each of the heat dissipation plates, and the hole may correspond to a cross section of the corresponding heat pipe 40. The heat pipe 40 may be disposed to pass through the hole to expand an area in contact with each heat dissipation plate.

Since the second fan 30 is disposed on an upper portion of the cover 10, the second fan 30 is formed to be open, and thus there is a concern that external moisture and foreign matter may pass through the second fan 30. In a case in which the moisture and foreign matter enters the vehicle controller 1, serious problems may occur in an electronic circuit, and thus it is important to prevent this case.

In the case of the present embodiment, at least a part of the heat dissipation plate constituting the heat dissipation fin 50 disposed under the second fan 30 is bent. As in FIG. 4, when at least a part of a lower end portion of the heat dissipation plate is formed to be bent in a perpendicular direction, even when moisture and foreign matter are introduced from the top, the moisture and foreign matter can be prevented from coming into direct contact with the circuit board. Since air should flow between the heat dissipation plates and be discharged upward, the heat dissipation plates may be disposed to be spaced the predetermined gap from each other so that are disposed at repeated positions with a predetermined step difference to prevent lower surfaces of the heat dissipation plates from being closed due to bent portions.

In the case of the present embodiment, at least a part of the heat dissipation plates 51 may be disposed at a relatively lower side, and heat dissipation plates 52 disposed between the heat dissipation plates disposed at the relatively lower side may be disposed on an upper side with a predetermined step difference. A length of a portion bent from the lower end portion of the heat dissipation plate and disposed in the horizontal direction may correspond to the gap between the heat dissipation plates.

Figure 5:
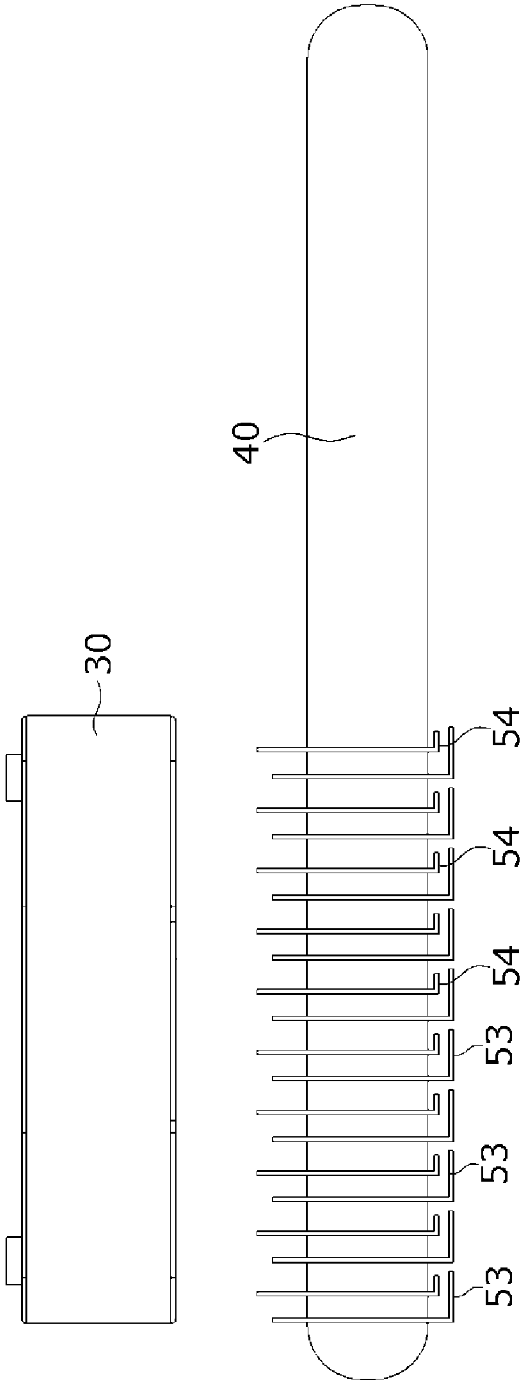
FIG. 5 is a view illustrating a heat dissipation fin of a vehicle controller heat dissipation module according to another embodiment of the present invention.

FIG. 5 is a view illustrating a heat dissipation fin of a vehicle controller heat dissipation module according to another embodiment of the present invention.

Referring to FIG. 5, in a heat dissipation fin 50, a plurality of heat dissipation plates are disposed in parallel to face each other, and at least parts of the heat dissipation plates may be formed to be bent at a lower side. In the case of the present embodiment, lower end portions of the heat dissipation plates may be vertically bent, and heat dissipation plates 53 having long bent portions and heat dissipation plates 54 having short bent portions may be used.

The heat dissipation plates 53 having the long bent portions may cover entire lower surfaces of portions on which the heat dissipation plates are disposed, and a predetermined gap may be set between the heat dissipation plates 53 having the long bent portions to allow air to flow. The heat dissipation plate 54 having the short bent portion may be disposed above the bent portion of the heat dissipation plate having the long bent portion and may be formed in a straight shape without being bent.

Figure 6:
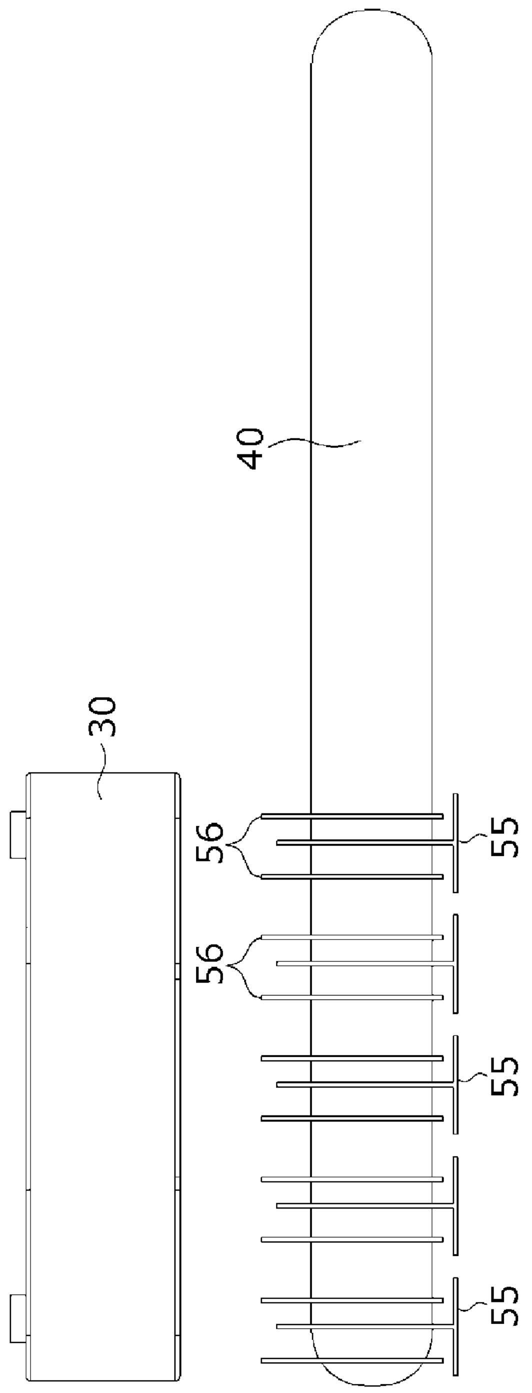
FIG. 6 is a view illustrating a heat dissipation fin of a vehicle controller heat dissipation module according to still another embodiment of the present invention.

FIG. 6 is a view illustrating a heat dissipation fin of a vehicle controller heat dissipation module according to still another embodiment of the present invention.

Referring to FIG. 6, in a heat dissipation fin 50, a plurality of heat dissipation plates may be disposed in parallel to face each other, and lower end portions of at least some heat dissipation plates 55 may be formed to be bent in both side directions. In the heat dissipation plates 55 of which the lower end portions are formed to be bent in both side directions, the bent portions may cover entire lower surfaces of portions in which the heat dissipation plates are disposed, and a predetermined gap may be provided between the heat dissipation plates 55 of which the lower end portions are bent in both side directions to allow air to flow.

Heat dissipation plates 56 each formed in a straight shape without being bent may be disposed between the heat dissipation plates 55 of which the lower end portions are bent in both side directions, and the corresponding heat dissipation plates 56 may be disposed above the bent portions of the heat dissipation plates 55 of which the lower end portions are bent in both side directions.

Figure 7:
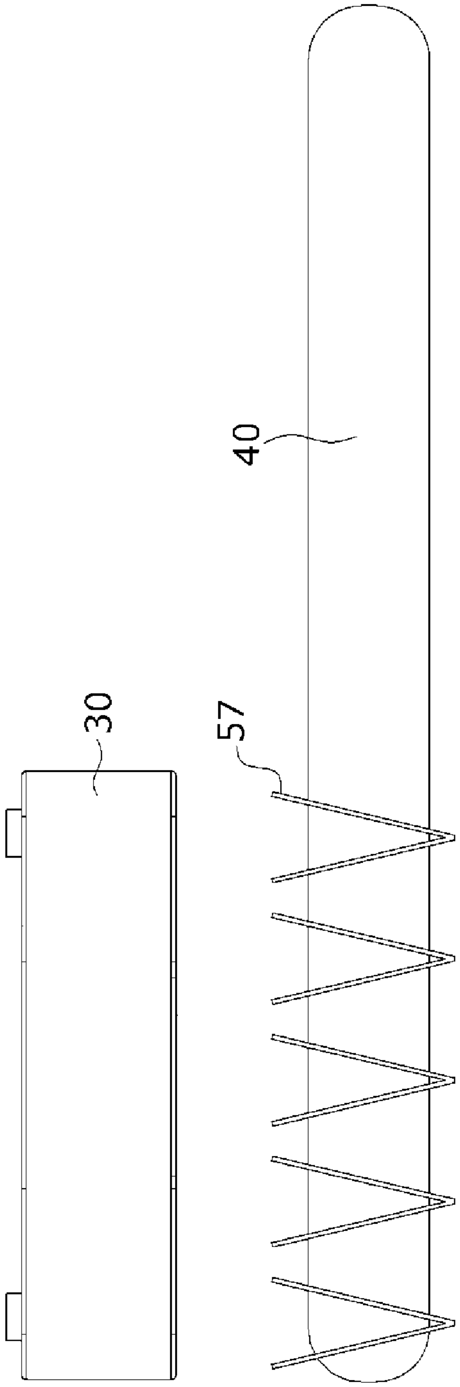
FIG. 7 is a view illustrating a heat dissipation fin of a vehicle controller heat dissipation module according to yet another embodiment of the present invention.

FIG. 7 is a view illustrating a heat dissipation fin of a vehicle controller heat dissipation module according to yet another embodiment of the present invention.

Referring to FIG. 7, in a heat dissipation fin 50, one end portions of a plurality of heat dissipation plates 57 may be disposed in contact with each other to be inclined at predetermined angles in a zigzag manner. Among the plurality of heat dissipation plates 57, two heat dissipation plates 57 may be disposed in pair so that lower end portions face to be in contact with each other and are inclined at the predetermined angle. Pairs of the heat dissipation plates 57 in contact with each other may be disposed with a predetermined distance therebetween to allow air to flow upward from below. When foreign matter such as moisture is introduced from the top at which a second fan 30 is disposed, the foreign matter such as moisture may be positioned between the heat dissipation plates 57, thereby preventing the foreign matter from coming into direct contact with a circuit board.

Figure 8:
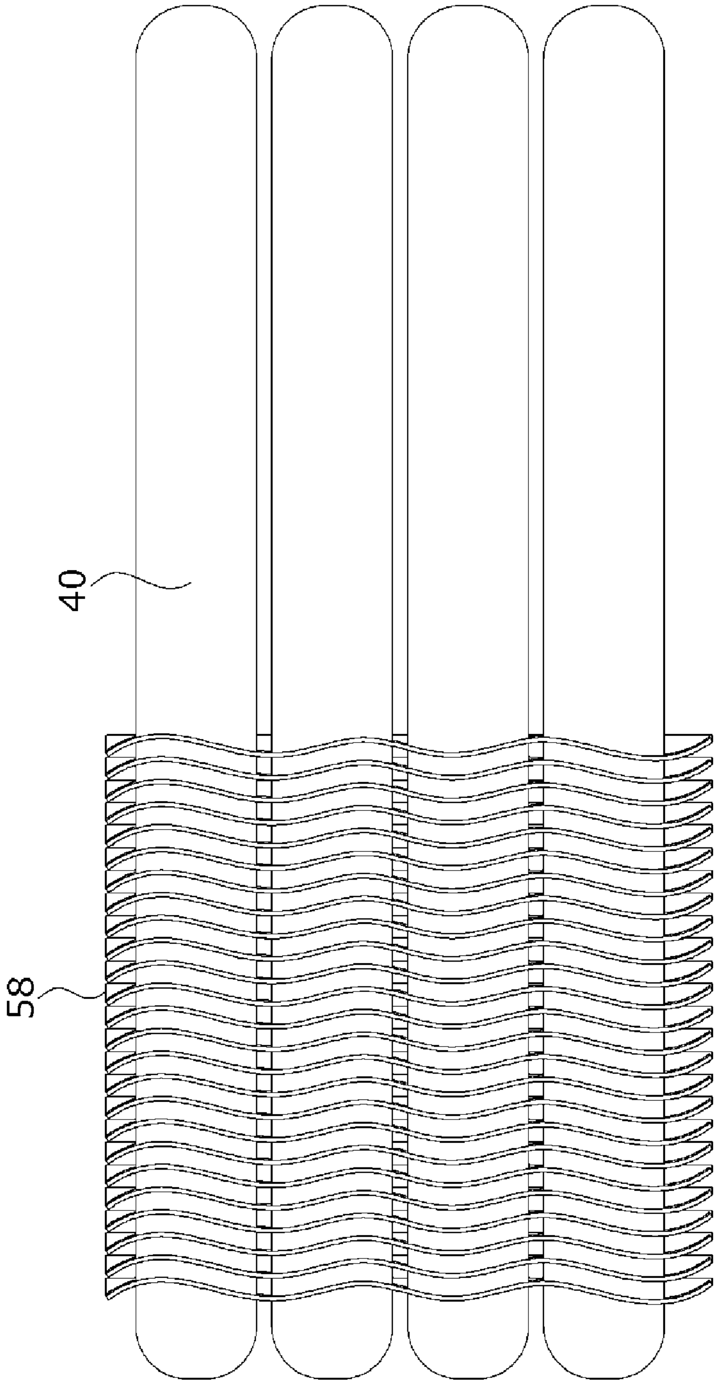
FIG. 8 is a view illustrating a heat dissipation fin of a vehicle controller heat dissipation module according to yet another embodiment of the present invention.
Figure 9:
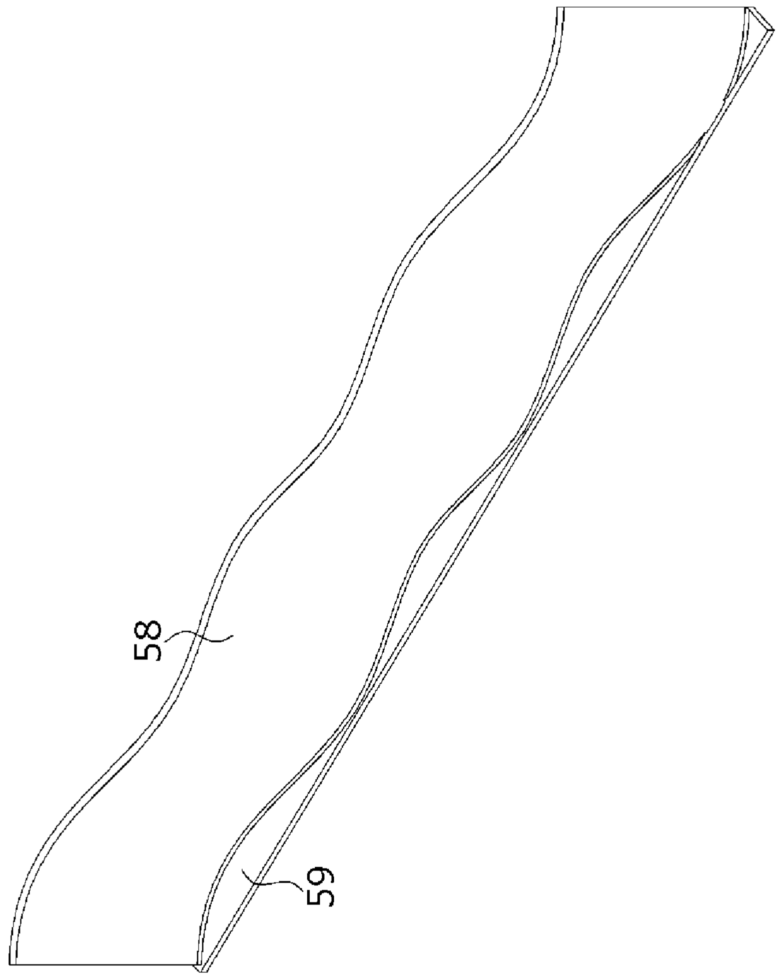
FIG. 9 is a view illustrating a heat dissipation fin of a vehicle controller heat dissipation module according to yet another embodiment of the present invention.

FIG. 8 is a view illustrating a heat dissipation fin of a vehicle controller heat dissipation module according to yet another embodiment of the present invention, and FIG. 9 is a view illustrating a heat dissipation fin of a vehicle controller heat dissipation module according to yet another embodiment of the present invention.

Referring to FIGS. 8 and 9, in a heat dissipation fin 50, heat dissipation plates 58 each formed in a wave shape are disposed in parallel to face each other. When the heat dissipation plate 58 is formed in the wave shape, a cross sectional area thereof becomes wider than a case in which the heat dissipation plate 58 is formed in a flat shape, and thus a heat dissipation effect can be improved more. The heat dissipation plates 58 each formed in the wave shape may be disposed in parallel with a predetermined gap.

A horizontal part 59 which is formed to be flat in the horizontal direction to prevent moisture and foreign matter from coming into contact with a circuit board may be formed on a lower surface of the heat dissipation plate 58. The horizontal part 59 may be formed in a flat plate shape and disposed to perpendicularly cross the heat dissipation plate 58 formed in the wave shape to cover a lower surface of a portion on which the heat dissipation plate 58 is disposed in a horizontal direction.

According to an embodiment of the present invention, a heat pipe formed in a horizontal direction is disposed in a vehicle controller to maintain a small size of the controller, and at the same time, a cooling fan can be disposed on the heat pipe to secure heat dissipation performance. In addition, a shape of a heat dissipation fin can be changed to prevent moisture and foreign matter from penetrating into a chip embedded in the controller.

Various useful advantages and effects of the present invention are not limited to the above-described contents, and can be more easily understood in the detailed description of specific embodiments of the present invention.

While the present invention has been described above with reference to the specific embodiments, it may be understood by those skilled in the art that various modifications and changes of the present invention may be made within a range not departing from the spirit and scope of the present invention defined by the appended claims.

What is claimed is:

1. A vehicle controller heat dissipation module comprising:

a cover configured to cover an upper surface of a vehicle controller;

a heat transfer part adjacent to a heating element in the vehicle controller;

a heat pipe disposed in a horizontal direction of the vehicle controller heat dissipation module and including a first portion in contact with the heat transfer part to receive heat from the heat transfer part generated by the heating element;

a heat dissipation fin in contact with a second portion of the heat pipe and configured to emit heat from the heat pipe;

a first fan disposed in a side surface of the vehicle controller and configured to introduce air into the vehicle controller; and a second fan configured to be disposed in or adjacent to an opening in the cover above the second portion of the heat pipe and heat dissipation fin to discharge air from inside the vehicle controller to an outside of the vehicle controller, wherein:

the heat transfer part is formed of a high thermal conductivity material and is located between the heating element and the heat pipe to transfer the heat generated by the heating element to the heat pipe; and the cover includes an outer surface, facing the outside of the vehicle controller, and an inner surface, wherein a protruding portion of the cover, thicker than at least one other portion of the cover, extends from the inner surface of the cover into contact with the first portion of the heat pipe.

2. The vehicle controller heat dissipation module of claim 1, wherein:

the heat dissipation fin is disposed to extend from the heat pipe in a vertical direction of the vehicle controller heat dissipation module; and the heat pipe passes through and is in contact with the heat dissipation fin.

3. The vehicle controller heat dissipation module of claim 2, wherein, in the heat dissipation fin, a plurality of heat dissipation plates are disposed to extend from the heat pipe in parallel to one another in the vertical direction.

4. The vehicle controller heat dissipation module of claim 3, wherein lower ends of at least some of the plurality of heat dissipation plates are bent to be non-vertical.

5. The vehicle controller heat dissipation module of claim 3, wherein lower ends of at least some of the plurality of heat dissipation plates extend in directions facing sides of the vehicle controller.

6. The vehicle controller heat dissipation module of claim 3, wherein:

each of the heat dissipation plates is of a wave shape; and a lower end portion of each of the heat dissipation plates is flat in the horizontal direction.

7. The vehicle controller heat dissipation module of claim 3, wherein first end portions of the plurality of heat dissipation plates are in contact with each other and inclined at predetermined angles in a zigzag manner.

8. The vehicle controller heat dissipation module of claim 2, wherein a portion between the heat transfer part and the heat pipe is coated with a gap filler.

9. The vehicle controller heat dissipation module of claim 1, wherein the heat transfer part is attached to the heating element.

10. The vehicle controller heat dissipation module of claim 4, wherein:

the lower ends of at least some of the heat dissipation plates extend substantially perpendicularly from respective upper portions of the heat dissipation plates; and the lower ends of the at least some of the heat dissipation plates are configured to prevent foreign matter and/or moisture entering into the vehicle dissipation module through the second fan from coming into contact with the heating element located under the heat transfer part.

11. The vehicle controller heat dissipation module of claim 10, wherein adjacent ones of the lower ends of the heat dissipation plates are offset from one another by a predetermined step difference so that, in respective pairs of adjacent lower ends of the heat dissipation plates, a first one of each pair is farther away from the heat pipe than a second one of the each pair.

12. The vehicle controller heat dissipation module of claim 1, wherein the heat transfer part and the heat pipe are formed of a same high thermal conductivity material.

13. The vehicle controller heat dissipation module of claim 1, wherein the cover is formed of a high thermal conductivity material.

14. The vehicle controller heat dissipation module of claim 1, wherein the protruding portion of the cover is formed of a material with higher thermal conductivity than material forming the at least one other portion of the cover.

* * * * *